(12) United States Patent
Zhang et al.

(10) Patent No.: US 8,861,065 B2
(45) Date of Patent: Oct. 14, 2014

(54) ELECTRONIC PAPER ACTIVE SUBSTRATE AND METHOD OF FORMING THE SAME AND ELECTRONIC PAPER DISPLAY PANEL

(71) Applicant: Boe Technology Group Co., Ltd., Beijing (CN)

(72) Inventors: Zhuo Zhang, Beijing (CN); Cuili Gai, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/703,469

(22) PCT Filed: Sep. 28, 2012

(86) PCT No.: PCT/CN2012/082361
§ 371 (c)(1),
(2), (4) Date: Dec. 11, 2012

(87) PCT Pub. No.: WO2013/075551
PCT Pub. Date: May 30, 2013

(65) Prior Publication Data
US 2014/0071514 A1    Mar. 13, 2014

(30) Foreign Application Priority Data

Nov. 23, 2011  (CN) .......................... 2011 1 0375687

(51) Int. Cl.
*G02B 26/00* (2006.01)
(52) U.S. Cl.
USPC .......................................... 359/290; 359/296
(58) Field of Classification Search
USPC .................................. 359/290–300; 345/107
IPC ............................................. G02F 1/167,1/133
See application file for complete search history.

(56) References Cited

U.S. PATENT DOCUMENTS 5,886,811 A * 3/1999 Min ............................... 359/291
5,920,421 A * 7/1999 Choi ............................. 359/291

(Continued)

FOREIGN PATENT DOCUMENTS

CN        1759344 A       4/2006
CN      101515102 A       8/2009

(Continued)

OTHER PUBLICATIONS

International Search Report issued Dec. 18, 2012; PCT/CN2012/082361.

(Continued)

*Primary Examiner* — Mohammed Hasan
(74) *Attorney, Agent, or Firm* — Ladas & Parry LLP

(57) ABSTRACT

Embodiments of the invention disclose an electronic paper active substrate and a method of forming the same and an electronic paper display panel. The electronic paper active substrate comprises: a base substrate, a gate electrode, a first common electrode, a second common electrode, a gate insulating layer, an active layer, source-drain electrodes, a passivation layer, a resin passivation layer, and a pixel electrode layer. The gate electrode and the first common electrode are arranged on the base substrate, and the gate is provided with the gate insulating layer, the active layer, the source-drain electrodes, the passivation layer, the resin passivation layer, and the pixel electrode layer sequentially arranged thereon; the first common electrode is provided with the gate insulating layer, the source-drain electrodes, the passivation layer, the second common electrode, the resin passivation layer, and the pixel electrode layer sequentially arranged thereon; and the first and second common electrodes are electrically connected to each other.

15 Claims, 6 Drawing Sheets

(56) References Cited

U.S. PATENT DOCUMENTS

| | | | | |
|---|---|---|---|---|
| 6,005,706 | A | * | 12/1999 | Hwang .................... 359/291 |
| 8,089,680 | B2 | * | 1/2012 | Jeong et al. ............... 359/254 |
| 8,441,711 | B2 | * | 5/2013 | Kwon et al. .............. 359/296 |
| 8,446,662 | B2 | * | 5/2013 | Hong et al. ............... 359/295 |
| 2006/0250558 | A1 | | 11/2006 | Burns et al. |
| 2009/0206339 | A1 | | 8/2009 | Park et al. |
| 2011/0170169 | A1 | | 7/2011 | Komatsu et al. |

FOREIGN PATENT DOCUMENTS

| | | |
|---|---|---|
| CN | 201555984 A | 8/2010 |
| CN | 102054833 A | 5/2011 |
| CN | 102645811 A | 8/2012 |
| JP | 2007-156388 A | 6/2007 |

OTHER PUBLICATIONS

First Chinese Office Action dated Aug. 28, 2013; Appln. No. 201110375687.3.
Korean Non-Final Rejection dated Oct. 31, 2013; Appln. No. 10-2012-7031145.
Korean Patent Office Notice of Allowance dated May 20, 2014; Appln. No. 10-2012-7031145.
International Preliminaiy Report on Patentability dated May 27, 2014; PCT/CN2012/082361.

* cited by examiner

ELECTRONIC PAPER ACTIVE SUBSTRATE AND METHOD OF FORMING THE SAME AND ELECTRONIC PAPER DISPLAY PANEL

CROSS REFERENCE TO RELATED APPLICATIONS

This application is a national stage application under 35 U.S.C. 371 and claims the benefit of PCT Application No. PCT/CN2012/082361 having an international filing date of Sep. 28, 2012, which designated the United States, which PCT application claimed the benefit of Chinese Application No. 201110375687.3 filed Nov. 23, 2011, the disclosure of each of which are incorporated herein by reference.

TECHNICAL FIELD

Embodiments of the present invention relate to an electronic paper active substrate, a method of forming the electronic paper active substrate, and an electronic paper display panel.

BACKGROUND

Electronic paper is one of novel and reusable electronic display devices, and has a shape of thin and flexible paper. Electrophoretic electronic paper is one kind of electronic papers, and displays images with the movement of charged particles comprising black particles and white particles upwards and downwards in applied electric fields. An active matrix driving technique is needed in order to display text information in an electronic paper. For example, thin film transistor (TFT) technique is one kind of techniques for active matrix driving.

Electrophoretic electronic paper is generally made by assembling an active substrate with an electrophoretic substrate to form a cell. The electrophoretic substrate is provided with a common electrode thereon, and is also coated with an electrophoretic particle layer; and the active substrate functions to input data signals to control images to be displayed in real time, and is formed of a plurality of pixel units arranged in a matrix.

The electrophoretic electronic paper has several advantages in that, for example, it has better visual properties such as contrast and brightness, low power consumption, and light weight easily for a thin profile, and can be formed into varieties of shapes. The electrophoretic electronic paper also has some disadvantages in that, for example, an electrophoretic electronic paper display panel needs a relatively high voltage, and a high voltage may result in a large leakage current. Therefore, in general, a large storage capacitor should be designed in order to keep charges stable.

In order to realize large storage capacitors, commercially available active electronic paper display panels need the storage capacitor to occupy nearly the whole of a pixel unit. This is because the electronic paper film is relatively thick, which makes the capacitance formed between a pixel electrode layer and a common electrode layer of the electrophoretic substrate small, so that a capacitor has to be formed between source-drain electrodes and the common electrode layer on the active substrate. That is, the capacitor formed between the source-drain electrodes and the common electrode layer on the active substrate becomes a main capacitor of each pixel, but the capacitor formed between the pixel electrode layer and the common electrode layer of the electrophoretic substrate may be neglected.

A current electronic paper has generally a resin passivation layer besides a passivation layer to reduce parasitic capacitance, so that the pixel electrode layer may be spread in a larger area. FIG. 1 shows a cross-section structure of the active substrate in a pixel (sub-pixel) structure of the current electronic paper. It can be seen from FIG. 1 that, in order to achieve a relatively large storage capacitor, a source-drain electrode 5 is spread in a large area in a pixel region. It can be known from the capacitance equation, $C=\in S/d$ (wherein "$\in$" is a dielectric constant of the dielectric between plates of a capacitor, "S" is an area in which the parallel plates face each other, and "d" is a distance between the parallel plates), that: the larger the $\in$, the larger the capacitance; the larger the area, the larger the capacitance; and the smaller the distance, the larger the capacitance. In the active substrate, the source-drain electrode 5 and the common electrode 3 correspond to the two plates of the capacitor, and a gate insulating layer 4 functions as an insulating layer. In the capacitance equation, since $\in$ is in connection with the insulating material filled between the two plates of the capacitor, $\in$ is substantially constant when the insulating material is selected. Therefore, in order to achieve large capacitance in each pixel of the active substrate, one measure is to increase the area in which the source-drain electrode faces the common electrode. However, this measure has less effect since the pixel area itself is limited. Another measure is to reduce the thickness of the gate insulating layer. However, if the gate insulating layer is too thin, short or breakdown between edges of the gate electrode and the source-drain electrodes might happen, and the properties of TFT (thin film transistor) might be influenced negatively.

Therefore, a problem to be solved at present is to increase storage capacitance effectively without influencing the properties of TFT devices.

SUMMARY

One of the problems to be solved by embodiments of the invention is to provide an electronic paper active substrate, which can increase storage capacitance effectively without influencing properties of TFT devices, an electronic paper display panel comprising the electronic paper active substrate, and a method for manufacturing the electronic paper active substrate, with respect to the above disadvantages in prior arts.

One embodiment of the invention provides an electronic paper active substrate, which comprises: a base substrate, a gate electrode, a first common electrode, a second common electrode, a gate insulating layer, an active layer, source-drain electrodes, a passivation layer, a resin passivation layer, and a pixel electrode layer; wherein the gate electrode and the first common electrode are arranged on the base substrate, the gate insulating layer, the active layer, the source-drain electrodes, the passivation layer, the resin passivation layer, and the pixel electrode layer are sequentially arranged on the gate electrode, the gate insulating layer, the source-drain electrodes, the passivation layer, the second common electrode, the resin passivation layer, and the pixel electrode layer are sequentially arranged on the first common electrode, and the first and second common electrodes are electrically connected to each other.

In one example, in the above mentioned electronic paper active substrate, the first and second common electrodes are arranged to be parallel to each other, and are connected electrically to each other by a second via hole passing through the gate insulating layer and the passivation layer.

In one example, in the above mentioned electronic paper active substrate, the material of the second common electrode is selected from a group consisting of metal, indium tin oxide, and a combination of metal and indium tin oxide.

In one example, the second common electrode comprises a metal.

In one example, in the above mentioned electronic paper active substrate, a ratio of an area of the first common electrode to that of a pixel electrode of a corresponding pixel unit in the pixel electrode layer is not less than 30%.

In one example, a ratio of an area of the second common electrode to that of a pixel electrode of a corresponding pixel unit in the pixel electrode layer is not less than 30%.

In one example, in the above mentioned electronic paper active substrate, a first via hole is formed through the resin passivation layer and the passivation layer on the source-drain electrode, on which the first and second common electrodes are not formed, so that the pixel electrode layer is connected to the source-drain electrode though the first via hole.

In the electronic paper active substrate according to the embodiment of the invention, the second common electrode is provided between the passivation layer and the resin passivation layer and the second common electrode can be connected to the first common electrode though the second via hole, thus a capacitor that originally comprises the source-drain electrodes and a single common electrode becomes one that comprises the source-drain electrodes and the first and second common electrodes, so that the storage capacitance is considerably increased (it may be increased nearly by two times), and the limit to the storage capacitance of the electronic paper can be expanded considerably.

Another embodiment of the invention provides a method for manufacturing an electronic paper active substrate, which comprises: a gate electrode and first common electrode forming step, for forming a gate electrode and a first common electrode on a base substrate; a gate insulating layer forming step, for forming a gate insulating layer on the gate electrode, the first common electrode, and a surface of the base substrate; an active layer forming step, for forming an active layer on the gate insulating layer; a source-drain electrode forming step, for forming source-drain electrodes on the active layer, wherein the source-drain electrodes are arranged at least partially on the gate insulating layer located on the first common electrode but do not cover the gate insulating layer on the first common electrode entirely; a passivation layer forming step, for forming a passivation layer on a structure resulted from the source-drain electrode forming step; a second via hole forming step, for forming a second via hole which passes through the passivation layer and the gate insulating layer, so that a portion of the first common electrode is exposed though the second via hole; and a second common electrode forming step, for forming a second common electrode, which is formed on the passivation layer and connected to the first common electrode through the second via hole.

In one example, the method for manufacturing the electronic paper active substrate further comprises: a resin passivation layer forming step, for forming a resin passivation layer on a surface of a resulted structure from the second common electrode forming step; a first via hole forming step, for forming a first via hole the source-drain electrodes, on which none of the first and second common electrodes is formed, to pass through the resin passivation layer and the passivation layer, so that a portion of the source-drain electrodes is exposed; and a pixel electrode layer forming step, for forming a pixel electrode layer on a surface of a resulted structure from the first via hole forming step, and the pixel electrode layer being connected to the exposed portion of the source-drain electrodes through the first via hole.

In one example, the method for manufacturing the electronic paper active substrate further comprises: a first forming step of the first via hole, for forming a lower part of the first via hole in the passivation layer after the passivation layer forming step.

In one example, in the method of manufacturing the electronic paper active substrate, the resin passivation layer forming fills the lower part of the first via hole with the resin passivation layer; the first via hole forming step further comprises a second forming step of the first via hole, for forming the first via hole in the resin passivation layer, the first via hole comprises the lower part of the first via hole, so that the first via hole exposes a portion of the source-drain electrode; and the pixel electrode layer forming step is used to form the pixel electrode layer on a surface of a structure resulted from the second forming step of the first via hole, and the pixel electrode layer is connected to the exposed portion of the source-drain electrode through the first via hole.

With the method of manufacturing an electronic paper active substrate provided by the embodiment of the invention, the second common electrode is provided between the passivation layer and the resin passivation layer and the second common electrode can be connected to the first common electrode though the second via hole, thus a capacitor that originally comprises the source-drain electrodes and a single common electrode becomes one that comprises the source-drain electrodes and the first and second common electrodes, so that the storage capacitance is considerably increased (it may be increased nearly by two times), and the limit to the storage capacitance of the electronic paper can be expanded considerably.

Another embodiment of the invention provides an electronic paper display panel, which comprises the above mentioned electronic paper active substrate.

The electronic paper display panel can also achieve the technical effects that are able to be realized by the electronic paper active substrate because of using the electronic paper active substrate provided by embodiments of the invention. That is, the second common electrode is provided between the passivation layer and the resin passivation layer and the second common electrode can be connected to the first common electrode though the second via hole, thus a capacitor that originally comprises the source-drain electrodes and a single common electrode becomes one that comprises the source-drain electrodes and the first and second common electrodes, so that the storage capacitance is considerably increased (it may be increased nearly by two times), and the limit to the storage capacitance of the electronic paper can be expanded considerably.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1:
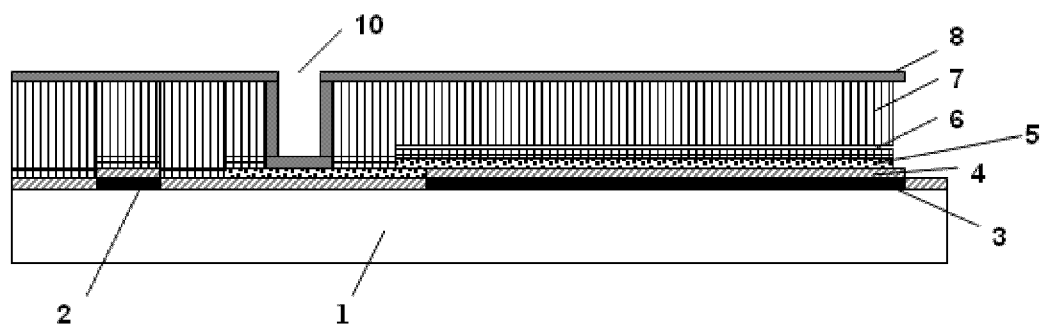
FIG. 1 is a cross-section structure view of the conventional electronic paper active substrate.

1—base substrate; 2—gate electrode; 3—first common electrode;
4—gate insulating layer; 5—source-drain electrodes; 6—passivation layer;
7—resin passivation layer; 8—pixel electrode layer;
9—second common electrode; 10—first via hole; 11—second via hole.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

It should be noted that the structures shown in the drawings of the embodiments are not to scale. Also, the like or similar elements are denoted with the like or similar reference numerals in the drawings.

An electronic paper active substrate according to an embodiment of the invention comprise: a base substrate, a gate electrode, a first common electrode, a gate insulating layer, an active layer, source-drain electrodes, a passivation layer, a second common electrode, a resin passivation layer, and a pixel electrode layer.

Figure 11:
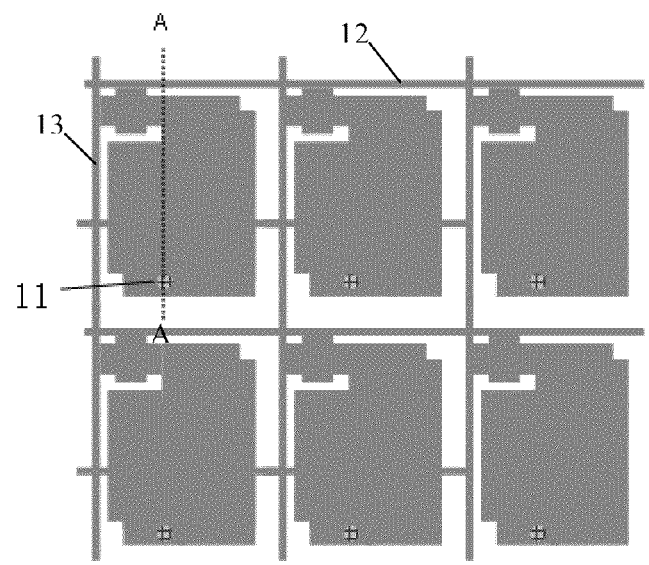
FIG. 11 is a plan view showing a possible electronic paper active substrate in FIG. 10.

As shown in FIG. 11, the active substrate comprises a plurality of gate lines and a plurality of data lines, which intersect each other to define a plurality of pixel units arranged in matrix. For example, each pixel unit comprises a thin film transistor as a switch element, a gate electrode of the thin film transistor and a corresponding gate line are connected to each other or formed integrally, one of source-drain electrodes of the thin film transistor and a corresponding data line are connected to each other or formed integrally, and the other of the source-drain electrodes is connected to a pixel electrode. The following description is made with respect to a single pixel unit, but applicable to other pixel units.

For example, the gate electrode and the first common electrode are arranged on the base substrate directly. The gate insulating layer covers the gate electrode and the first common electrode, and covers the surface of a part of the base substrate which is not covered by the gate electrode and the first common electrode.

For example, a portion of the source-drain electrodes is arranged on a portion of the gate insulating layer that is located on the first common electrode (i.e., the gate insulating layer on the first common electrode is not entirely covered by the source-drain electrode), and the other portion of the source-drain electrode may also be arranged on a portion of the gate insulating layer on the base substrate. There is an active layer (not shown in the drawings) interposed between the gate insulating layer and the source-drain electrode.

For example, a portion of the passivation layer is arranged on a portion of the gate insulating layer located on the first common electrode, and a portion of the passivation layer covers the source-drain electrodes, the gate insulating layer on the gate electrode and adjacent regions.

For example, the second common electrode is disposed on the passivation layer.

For example, the first and second common electrodes are connected to each other through a second via hole, and the second via hole passes through the gate insulating layer and the passivation layer.

For example, the resin passivation layer covers the second common electrode, and also covers a portion of the gate insulating layer.

For example, at the upmost level, the pixel electrode layer covers the resin passivation layer.

It may be seen that there are sequentially arranged the gate insulating layer, the active layer, the source-drain electrodes, the passivation layer, the resin passivation layer, and the pixel electrode layer on the gate electrode; and there are sequentially arranged the gate insulating layer, the source-drain electrodes, the passivation layer, the second common electrode, the resin passivation layer, and the pixel electrode layer on the first common electrode.

For example, a first via hole is formed at the surface of the electronic paper active substrate.

The gate electrode, the gate insulating layer, the active layer, the source-drain electrodes constitute a thin film field effect transistor (TFT). The pixel electrode layer comprises a pixel electrode for each pixel unit for display by this corresponding pixel. The resin passivation layer may be used to reduce parasitic capacitance to enlarge aperture ratio. The thin film field effect transistor functions as a switch element, and is used to control whether power is applied to a pixel electrode.

The first and second common electrodes belong to common electrodes, which function to constitute storage capacitors for the corresponding pixel units on the active substrate. It can be seen that, because of adding a conductive layer (the second common electrode) between the passivation layer and the resin passivation layer and making the conductive layer be electrically connected to the first common electrode though a via hole (the second via hole), the area of one plate of a capacitor is increased from the area of a single common electrode to the area of two common electrodes, so that the area of the plate is increased nearly by two times, the first and second common electrodes together form a larger capacitor with the source-drain electrodes, and then the storage capacitance of the pixel is considerably increased.

For example, the first and second common electrodes are arranged parallel to each other, so that the effect of increasing the storage capacitance is maximized.

For example, the first and second common electrodes may use a same material, or may use different materials.

For example, the second common electrode may be a metal, such as Mo, MO/Al/Mo, Mo/Al/Nd/Mo, or the like, or may be indium tin oxide (ITO), or may be the combination of metal and indium tin oxide. Furthermore, in order to reduce resistance, the second common electrode may be for example metal.

For example, the ratio of an area of the first common electrode to that of the pixel electrode of a corresponding pixel unit is not less than 30%. For example, the ratio of an area of the second common electrode to that of the pixel electrode of a corresponding pixel unit is not less than 30%. Thereby, the better effect of increasing the storage capacitance can be assured.

First Embodiment

Hereinafter, an exemplary embodiment of a method for manufacturing an electronic paper active substrate according to the first embodiment will be introduced with reference to FIG. 2-10. Only one pixel unit is shown in the drawing, and other pixel units may be formed in the same steps.

Figure 12:
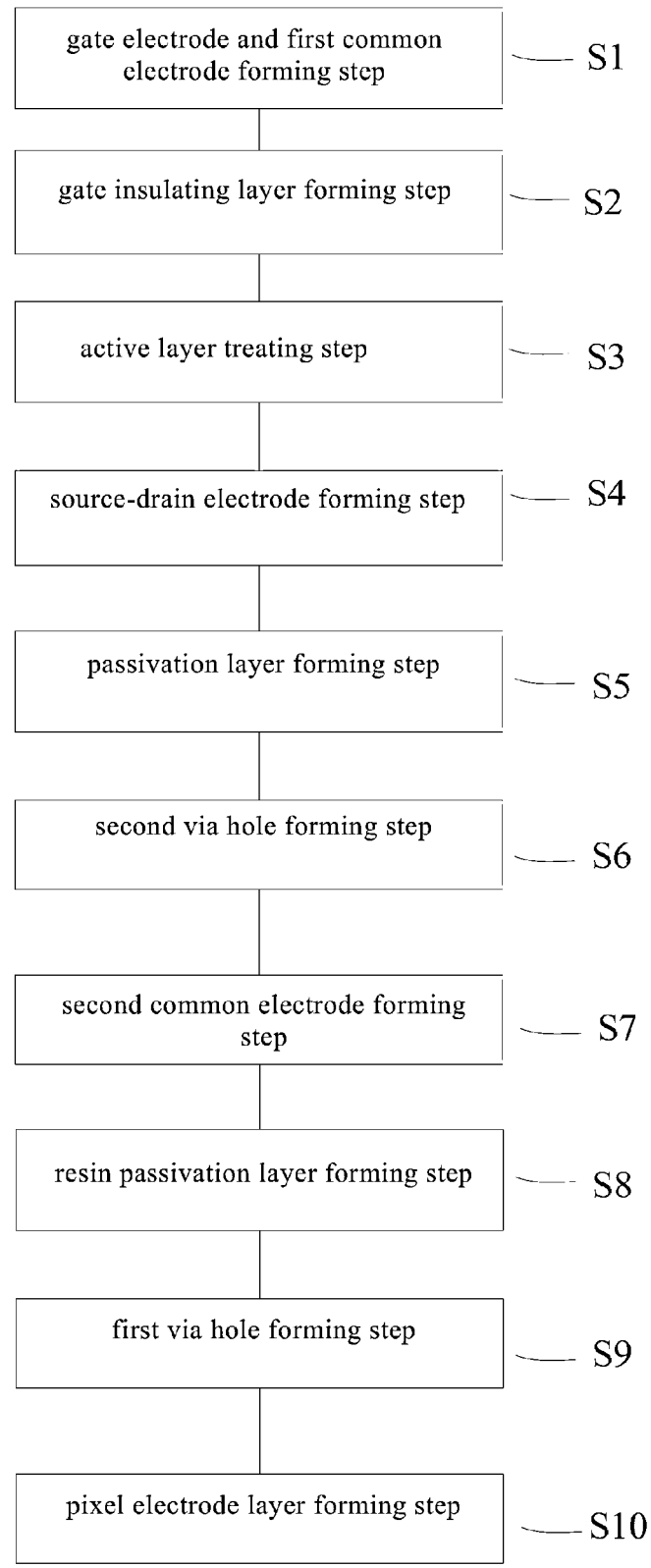
FIG. 12 is a flow chart of a method for manufacturing the electronic paper active substrate according to the first embodiment of the invention.

FIG. 12 is a flow chart of a method for manufacturing an electronic paper active substrate according to the first embodiment of the invention. As shown in FIG. 12, the method for manufacturing the electronic paper active substrate according to the embodiment comprises the following steps.

Figure 2:
FIG. 2 is a cross-section view of an electronic paper active substrate according to a first embodiment of the invention after a gate electrode and a first common electrode are formed.

A step S1 of forming a gate electrode and a first common electrode, which is used to form the gate electrode 2 (which is made by forming a metal layer for example) and the first common electrode 3 on a substrate by, for example, a photolithographic process. FIG. 2 shows a cross-section view after the gate electrode 2 and the first common electrode 3 are formed in the active substrate. It can be seen from this drawing that the first common electrode 3 occupies nearly most region of the pixel unit. For example, the ratio of the area of the first common electrode 3 to the pixel electrode layer of a corresponding pixel unit is not less than 30%. The gate electrode 2 and the first common electrode 3 can be formed of a same conductive material such as metal or conductive metal oxide or formed of different conductive materials. In this step gate lines can be formed as well, and the gate electrode 2 is connected with a corresponding gate line.

Figure 3:
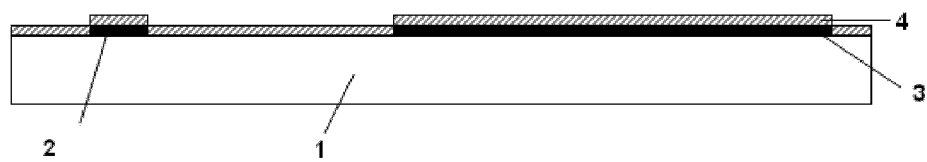
FIG. 3 is a cross-section view of the electronic paper active substrate according to the first embodiment of the invention after a gate insulating layer is formed.

A step S2 of forming a gate insulating layer, which is used to forming the gate insulating layer 4 on the gate electrode 2, the first common electrode 3, and the surface of the substrate (for example, the material of the gate insulating layer uses silicon oxide). FIG. 3 shows a cross-section view after the gate insulating layer 4 is formed in the active substrate, and it can be seen from this drawing that the gate insulating layer nearly covers the whole region of a pixel unit.

A step S3 of treating an active layer, which is used to perform treatments, such as deposition, activation, patterning via etching, and the like, on the active layer (not shown in the drawings). The structure and the treatments of the active layer (or referred to as active region) may adopt the conventional techniques, which are omitted here.

Figure 4:
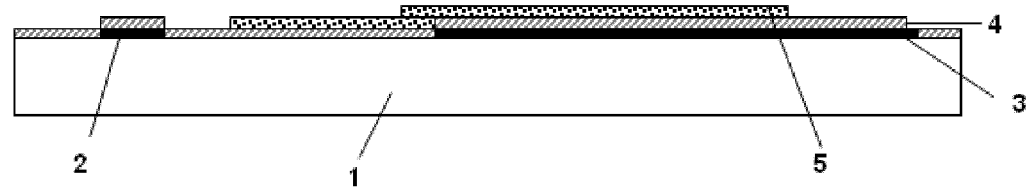
FIG. 4 is a cross-section view of the electronic paper active substrate according to the first embodiment of the invention after source-drain electrodes are formed.

A step S4 of forming source-drain electrodes, which is used to form the source-drain electrodes 5 on the gate insulating layer. The source-drain electrodes 5 are arranged at least partially on the gate insulating layer 4 located on the first common electrode 3; and the source-drain electrode 5 does not cover the gate insulating layer 4 on the first common electrode 3 entirely, but leaves a small region exposed which is ready for the formation of via holes (e.g., a second via hole 11 shown in FIG. 6) in subsequential steps. The remained region in FIG. 4 is the right portion in the drawing. In the step S4, a channel in the active layer (not shown in the drawings) is further formed by using the source-drain electrodes 5 as a self-alignment mask and using for example etching process. These process steps may be performed using the processes in prior art, and FIG. 4 shows a cross-section view after the source-drain electrodes 5 are formed in the active substrate. In this step, a plurality of data lines can be formed; one of the source-drain electrodes 5 of a thin film transistor is electrically connected to a corresponding data line, while the other of the source-drain electrodes 5 is electrically connected to the pixel electrode formed later.

Figure 5:
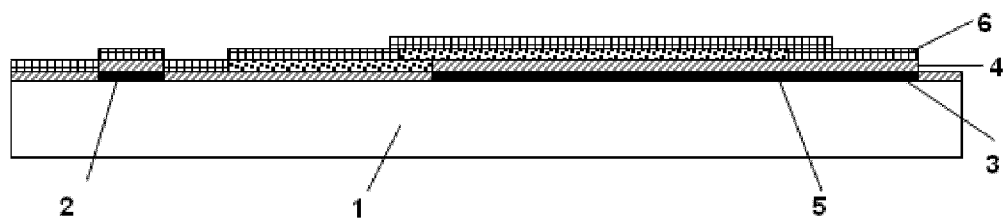
FIG. 5 is a cross-section view of the electronic paper active substrate according to the first embodiment of the invention after a passivation layer is formed.

A step S5 of forming a passivation layer, which is used to deposit the passivation layer 6 on the resultant structure by, for example, plasma enhanced chemical vapor deposition (PECVD) using suitable material such as $SiO_2$, SiNx, or other suitable material. For example, the passivation layer 6 is formed on the source-drain electrodes 5 and the gate insulating layer 4 located on the first common electrode 3, and on the gate insulating layer 4 located on the gate electrode 2 and the regions adjacent to the gate electrode 2. FIG. 5 shows a cross-section view after the passivation layer 6 is formed in the active substrate.

Figure 6:
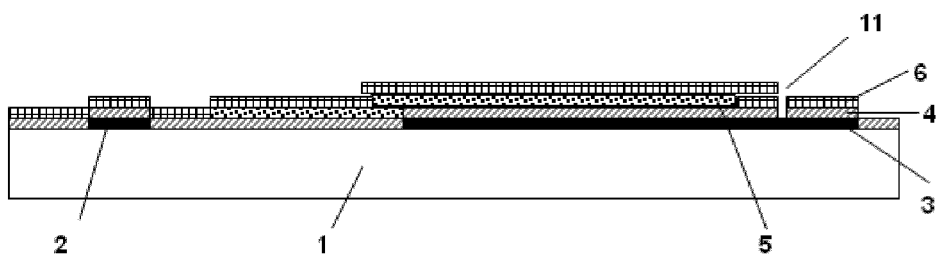
FIG. 6 is a cross-section view of the electronic paper active substrate according to the first embodiment of the invention after a second via hole is formed.

A step S6 of forming the second via hole, which is used to form one second via hole 11 by means of for example a photolithographic process, and make it pass through both the passivation layer 6 and the gate insulating layer 4. Thus, a portion of the first common electrode 3 may be exposed through the second via hole 11. FIG. 6 shows a cross-section view after the second via hole 11 is formed in the active substrate.

Figure 7:
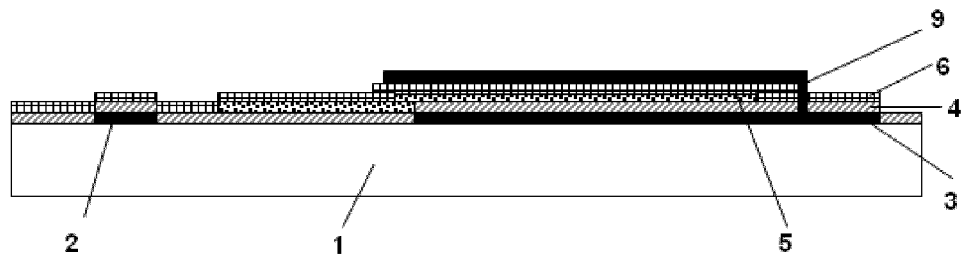
FIG. 7 is a cross-section view of the electronic paper active substrate according to the first embodiment of the invention after a second common electrode is formed.
Figure 9:
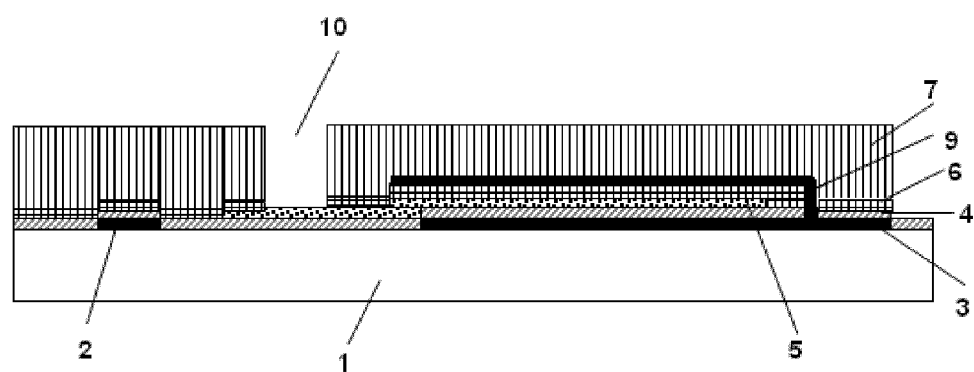
FIG. 9 is a cross-section view of the electronic paper active substrate according to the first embodiment of the invention after a first via hole is formed.
Figure 10:
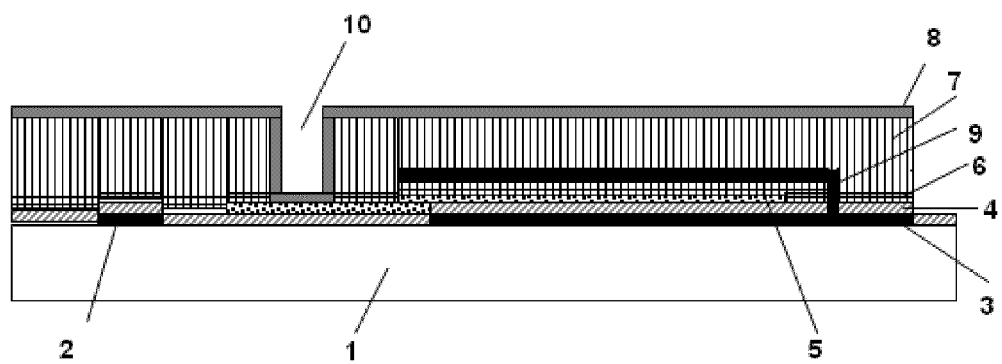
FIG. 10 is a cross-section view of the electronic paper active substrate according to the first embodiment of the invention after a pixel electrode layer is formed.

A step S7 of forming a second common electrode, which is used to form the second common electrode 9, which is connected to the first common electrode 3 through the second via hole 11 formed in the above step. FIG. 7 shows a cross-section view after the second common electrode 9 is formed in the active substrate. In the horizontal direction shown in FIG. 7, the second common electrode 9 overlaps the source-drain electrode 5 to a large extent, and a ratio of the area of the second common electrode 9 to that of the later formed pixel electrode layer 8 is not less than 30% so as to form a large storage capacitor. Also, the second common electrode 9 does not cover a first via hole (as shown in FIGS. 9 and 10), which is connected between the resin passivation layer 7 formed in subsequential steps and the source-drain electrodes 5. For example, the second common electrode 9 may be a metal, such as Mo, Al, Cu, Al, Nd and the like, and alloys thereof, or may be indium tin oxide or the like.

Figure 8:
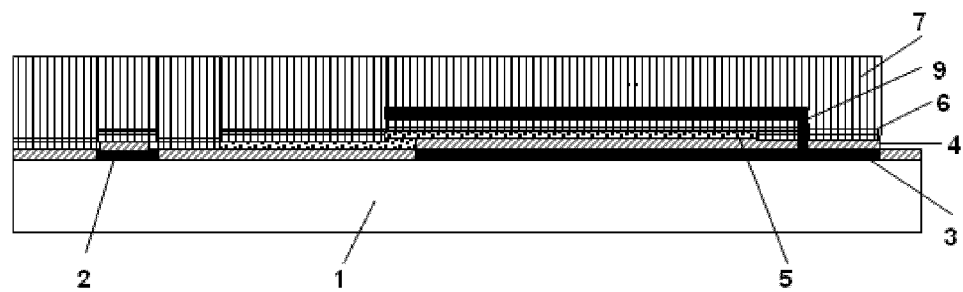
FIG. 8 is a cross-section view of the electronic paper active substrate according to the first embodiment of the invention after a resin passivation layer is formed.

A step S8 of forming a resin passivation layer, which is used to form the resin passivation layer 7 on the surface of the resulted structure from the step S7. The basic requirements of the material of the resin passivation layer 7 include relative low dielectric constant, i.e., $\in<5$. For example, the material for the resin passivation layer 7 may be PC403, PC405G, PC411B, PC415G, or PC542 of JSR Corporation, DA-2009 of Donjin Corporation, or the like. FIG. 8 shows a cross-section view after the resin passivation layer 7 is formed in the active substrate.

A step S9 of forming a first via hole, which is used to form one first via hole 10 that passes through the resin passivation layer 7 and the passivation layer 6 so as to expose a portion of the source-drain electrodes 5, so that the exposed portion of the source-drain electrodes 5 can contact with and be connected to the later formed pixel electrode layer 8. In the step S9, since not only the resin passivation layer 7 but also the passivation layer 6 (e.g., $SiO_2$ or SiNx) need to be etched, a dry etching process may be adopted to etch the above two materials in one process; or in another example, the etching may be done by two steps, i.e., an upper part of the first via hole 10 may be formed firstly in the resin passivation layer 7 by using wet etching, and then a corresponding lower part of the first via hole 10 is formed in the passivation layer of $SiO_2$ or SiNx by using dry etching. FIG. 9 shows a cross-section view after the first via hole 10 is formed in the active substrate. Because the patterning methods are different for different resin passivation layers 7, the etching process (e.g., wet etching or dry etching) may be selected according to a particular resin passivation layer 7. Such selection may be made according to the common knowledge in the art, and detail introductions thereof are omitted herein.

A step S10 of forming a pixel electrode layer, which is used to form the pixel electrode layer 8 on a surface of the electronic paper active substrate. The pixel electrode 8 comprises a pixel electrode for each pixel unit, and this pixel electrode is connected to the exposed portion of the source-drain electrodes 5 through the first via hole 10. FIG. 10 shows a cross-section view after the pixel electrode layer is formed in the active substrate.

With the above method of forming the electronic paper active substrate according to this embodiment, the structures of the electronic paper active substrate as shown in FIGS. 10 and 11 are obtained. FIG. 11 is a possible plane view of the electronic paper active substrate shown in FIG. 10; FIG. 11 shows an electronic paper active substrate comprising six pixel unit structure, but the pixel units in this embodiment are not limited thereto. FIG. 10 is a cross-section view of an electronic paper active substrate taken along the line A-A shown in FIG. 11. FIGS. 10 and 11 each show clearly the locations of the second via holes 11 in the electronic paper active substrate.

It should be understood that even though, with reference to FIGS. 2-12, the above descriptions introduce an electronic paper active substrate and a method for manufacturing the same according to the embodiment step by step, the invention does not exclude other step(s) besides the above mentioned steps. Therefore, other step(s) may be added into the above described steps to form other structures or realize other objects without departing from the scopes of the invention.

Second Embodiment

This embodiment differs from the first embodiment in that: the method of manufacturing the electronic paper active substrate according to the first embodiment needs to etch both of the resin passivation layer 7 and the passivation layer 6 in the step S9 of forming the first via hole to form the first via hole; but in the present embodiment, the process in the step S9 of forming the first via hole 10 is simplified, i.e., by adding a first forming step for forming a first via hole 10 (for example by etching) after the step S5 of forming the passivation layer 6 or the step S6 of forming the second via hole 11, so that a structure comprising the second via hole 11 and the lower part of the first via hole 10 may be obtained conveniently.

Figure 13:
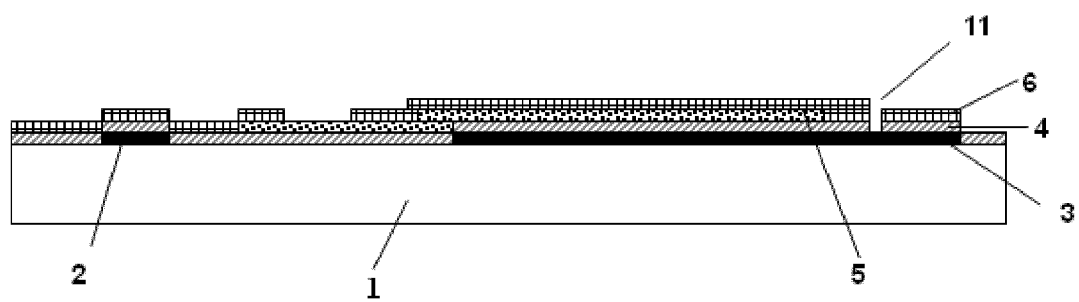
FIG. 13 is a cross-section view of an electronic paper active substrate according to a second embodiment of the invention after a second via hole and a lower part of a first via hole are formed simultaneously.

The step of forming the second via hole and the first forming step of the first via hole may be performed in a same etching step, i.e., both of the second via hole and the lower part of the first via hole are formed in one process with one mask, as shown in FIG. 13. Thereby, process is simplified.

Then, the step S8 of forming the resin passivation layer will fill the lower part of the first via hole. Subsequently, in the step S9 of forming the first via hole, only the material of the resin passivation layer needs to be etched in one process, and thereby the structure shown in FIG. 9 may be formed.

The other steps in the method of manufacturing the electronic paper active substrate according to the present embodiment are the same as those of the first embodiment, and thus the detail introductions thereof are omitted herein.

The electronic paper active substrate according to the embodiments of the invention comprises the structure of the second common electrode, and thus a single common electrode is increased to two common electrodes, so that the area of the capacitor plates is increased nearly by two times, the storage capacitance of the pixel is increased nearly by two times, and the properties of the resultant thin film transistor (TFT) device are not influenced negatively.

Further, an embodiment of the invention provides an electronic paper display panel, which comprises the electronic paper active substrate according to the first embodiment or the second embodiment and an electrophoretic substrate. The electrophoretic substrate is provided with a common electrode thereon, and is also coated with an electrophoretic particle layer. The active substrate functions to input data signals to control images real-timely, and comprises a plurality of pixel units arranged in matrix. Since the electronic paper active substrates according to the embodiments of the invention have relatively large storage capacitance, the ability of the electronic paper display panel against high voltage and large leakage current can be enhanced effectively.

Any simple variations, equal changes, and modifications made to the above embodiments according to the technical spirit of the invention, without departing from the contents of the technical solutions of the invention, are all within the scope of the technical solutions of the invention

The invention claimed is:

1. An electronic paper active substrate comprising: a base substrate, a gate electrode, a first common electrode, a second common electrode, a gate insulating layer, an active layer, source-drain electrodes, a passivation layer, a resin passivation layer, and a pixel electrode layer; wherein
    the gate electrode and the first common electrode are arranged on the base substrate,
    the gate insulating layer, the active layer, the source-drain electrodes, the passivation layer, the resin passivation layer, and the pixel electrode layer are sequentially arranged on the gate electrode,
    the gate insulating layer, the source-drain electrodes, the passivation layer, the second common electrode, the resin passivation layer, and the pixel electrode layer are sequentially arranged on the first common electrode, and
    the first and second common electrodes are electrically connected to each other.

2. The electronic paper active substrate according to claim 1, wherein the first and second common electrodes are arranged to be parallel to each other, and are connected electrically to each other by a second via hole passing through the gate insulating layer and the passivation layer.

3. The electronic paper active substrate according to claim 2, wherein the material of the second common electrode is metal or indium tin oxide, or a combination of metal or indium tin oxide.

4. The electronic paper active substrate according to claim 2, wherein a ratio of an area of the first common electrode to that of a pixel electrode of a corresponding pixel unit in the pixel electrode layer is not less than 30%.

5. The electronic paper active substrate according to claim 2, wherein a ratio of an area of the second common electrode to that of a pixel electrode of a corresponding pixel unit in the pixel electrode layer is not less than 30%.

6. The electronic paper active substrate according to claim 2, wherein a first via hole is formed through the resin passivation layer and the passivation layer on the source-drain electrode, on which the first and second common electrodes are not formed, so that the pixel electrode layer is electrically connected to the source-drain electrode though the first via hole.

7. The electronic paper active substrate according to claim 1, wherein the material of the second common electrode is metal or indium tin oxide, or a combination of metal or indium tin oxide.

8. The electronic paper active substrate according to claim 1, wherein a ratio of an area of the first common electrode to that of a pixel electrode of a corresponding pixel unit in the pixel electrode layer is not less than 30%.

9. The electronic paper active substrate according to claim 1, wherein a ratio of an area of the second common electrode to that of a pixel electrode of a corresponding pixel unit in the pixel electrode layer is not less than 30%.

10. The electronic paper active substrate according to claim 1, wherein a first via hole is formed through the resin passivation layer and the passivation layer on the source-drain electrode, on which the first and second common electrodes are not formed, so that the pixel electrode layer is electrically connected to the source-drain electrode though the first via hole.

11. An electronic paper display panel comprising the electronic paper active substrate according to claim 1.

12. A method for manufacturing an electronic paper active substrate comprising:
   a gate electrode and first common electrode forming step, for forming a gate electrode and a first common electrode on a base substrate;
   a gate insulating layer forming step, for forming a gate insulating layer on the gate electrode, the first common electrode, and a surface of the base substrate;
   an active layer forming step, for forming an active layer on the gate insulating layer;
   a source-drain electrode forming step, for forming source-drain electrodes on the active layer, wherein the source-drain electrodes are arranged at least partially on the gate insulating layer located on the first common electrode but do not cover the gate insulating layer on the first common electrode entirely;
   a passivation layer forming step, for forming a passivation layer on a structure resulted from the source-drain electrode forming step;
   a second via hole forming step, for forming a second via hole which passes through the passivation layer and the gate insulating layer, so that a portion of the first common electrode is exposed though the second via hole; and
   a second common electrode forming step, for forming a second common electrode, which is formed on the passivation layer and connected to the first common electrode through the second via hole.

13. The method for manufacturing an electronic paper active substrate according to claim 12, further comprising:
   a resin passivation layer forming step, for forming a resin passivation layer on a surface of a resulted structure from the second common electrode forming step;
   a first via hole forming step, for forming a first via hole the source-drain electrodes, on which none of the first and second common electrodes is formed, to pass through the resin passivation layer and the passivation layer, so that a portion of the source-drain electrodes is exposed; and
   a pixel electrode layer forming step, for forming a pixel electrode layer on a surface of a resulted structure from the first via hole forming step, and the pixel electrode layer being connected to the exposed portion of the source-drain electrodes through the first via hole.

14. The method for manufacturing an electronic paper active substrate according to claim 13, wherein the first via hole forming step comprises:
   a first forming step of the first via hole, for forming a lower part of the first via hole in the passivation layer after the passivation layer forming step.

15. The method for manufacturing an electronic paper active substrate according to claim 14, wherein the resin passivation layer forming fills the lower part of the first via hole with the resin passivation layer;
   the first via hole forming step further comprises a second forming step of the first via hole, for forming the first via hole in the resin passivation layer, the first via hole comprises the lower part of the first via hole, so that the first via hole exposes a portion of the source-drain electrode; and
   the pixel electrode layer forming step is used to form the pixel electrode layer on a surface of a structure resulted from the second forming step of the first via hole, and the pixel electrode layer is connected to the exposed portion of the source-drain electrode through the first via hole.

\* \* \* \* \*